(12) United States Patent
Bhardwaj et al.

(10) Patent No.: US 9,698,451 B2
(45) Date of Patent: Jul. 4, 2017

(54) USING REFERENCE ELECTRODES TO MANAGE BATTERIES FOR PORTABLE ELECTRONIC DEVICES

(75) Inventors: Ramesh C. Bhardwaj, Fremont, CA (US); Sheba Devan, Santa Clara, CA (US); Taisup Hwang, Santa Clara, CA (US); Richard M. Mank, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 1080 days.

(21) Appl. No.: 13/177,468

(22) Filed: Jul. 6, 2011

(65) Prior Publication Data

US 2013/0009604 A1    Jan. 10, 2013

(51) Int. Cl.
| H02J 7/00 | (2006.01) |
| --- | --- |
| H01M 10/44 | (2006.01) |
| H01M 10/42 | (2006.01) |
| H01M 10/48 | (2006.01) |
| G01R 31/36 | (2006.01) |
| H01M 10/052 | (2010.01) |

(52) U.S. Cl.
CPC ......... *H01M 10/44* (2013.01); *H01M 10/425* (2013.01); *H01M 10/48* (2013.01); *G01R 31/3658* (2013.01); *G01R 31/3679* (2013.01); *H01M 10/052* (2013.01); *H01M 2010/4271* (2013.01); *H01M 2010/4292* (2013.01); *H01M 2220/30* (2013.01)

(58) Field of Classification Search
USPC .................................................. 320/134–136
See application file for complete search history.

(56) References Cited

U.S. PATENT DOCUMENTS

| 4,873,158 | A  * | 10/1989 | Chang et al. .................. 429/61 |
| --- | --- | --- | --- |
| 7,635,541 | B2 | 12/2009 | Scott |
| 2006/0057433 | A1* | 3/2006 | Ando et al. ....................... 429/9 |
| 2006/0121352 | A1* | 6/2006 | Kejha et al. .................. 429/232 |
| 2008/0050644 | A1 | 2/2008 | Christensen et al. |
| 2009/0104510 | A1 | 4/2009 | Fulop |
| 2009/0259420 | A1 | 10/2009 | Greening et al. |
| 2011/0250478 | A1* | 10/2011 | Timmons et al. .............. 429/91 |
| 2012/0158330 | A1* | 6/2012 | Araki .............................. 702/63 |

FOREIGN PATENT DOCUMENTS

EP            1577914          9/2005

* cited by examiner

*Primary Examiner* — Samuel Berhanu
(74) *Attorney, Agent, or Firm* — Blank Rome LLP (57) ABSTRACT

The disclosed embodiments provide a system that manages use of a battery in a portable electronic device. During operation, the system uses a reference electrode in the battery to monitor an anode potential of an anode in the battery during charging of the battery in the portable electronic device. If the anode potential falls below an anode potential threshold, the system modifies a charging technique for the battery to extend a cycle life of the battery. For example, the system may reduce a charge current of the battery if the anode potential falls below the anode potential threshold to prevent degradation caused by a negative anode potential during charging of the battery.

20 Claims, 10 Drawing Sheets

USING REFERENCE ELECTRODES TO MANAGE BATTERIES FOR PORTABLE ELECTRONIC DEVICES

BACKGROUND

Field

The present embodiments relate to batteries for portable electronic devices. More specifically, the present embodiments relate to techniques for using reference electrodes to manage the design and use of lithium-polymer batteries with the portable electronic devices.

Related Art

Portable electronic devices, such as laptop computers, portable media players, and/or mobile phones, typically operate using a rechargeable battery. Furthermore, designs for such batteries often include battery packs that contain battery cells connected together in various series and parallel configurations.

During operation, the battery's capacity may diminish over time from use, age, lack of maintenance, damage, heat, and/or manufacturing defects. For example, oxidation of electrolyte, degradation of cathode and anode material, and/or lithium plating on the anode surface of a battery may be caused by repeated and/or inefficient (e.g., constant-current) charging of the battery, which in turn may cause a gradual reduction in the battery's capacity. As the battery continues to age and degrade, the capacity's rate of reduction may increase. Once the battery reaches 80% of initial capacity, the battery's useful life may be finished.

Subsequent use of a battery beyond the battery's end-of-life may cause swelling of the battery's cells and continued lithium plating on the battery's anode surface while providing little power to the portable electronic device. Moreover, conventional battery-monitoring mechanisms may not include functionality to manage such swelling and/or lithium plating. As a result, a user of the portable electronic device may not be aware of the battery's degraded state until the battery fails and/or the device is damaged, which can possibly involve a fire, an explosion, and/or an electrical short.

Hence, what is needed is a mechanism for managing and mitigating degradation, loss of capacity, and/or faults in batteries for portable electronic devices.

SUMMARY

The disclosed embodiments provide a system that manages use of a battery in a portable electronic device. During operation, the system uses a reference electrode in the battery to monitor an anode potential of an anode in the battery during charging of the battery in the portable electronic device. If the anode potential falls below an anode potential threshold, the system modifies a charging technique for the battery to extend a cycle life of the battery. For example, the system may reduce a charge current of the battery if the anode potential falls below an anode potential threshold of 0.0V to prevent degradation caused by a negative anode potential during charging of the battery.

In some embodiments, the system also uses the reference electrode to monitor the anode potential and a cathode potential of a cathode in the battery during use of the battery with the portable electronic device, and uses the anode potential and the cathode potential to assess a state-of-health of the battery.

In some embodiments, using the anode potential and the cathode potential to assess the state-of-health of the battery involves at least one of:

(i) analyzing a fault in the battery;
(ii) assessing an electrode balance of the anode and the cathode; and
(iii) detecting degradation in the battery.

In some embodiments, assessing the electrode balance of the anode and the cathode involves comparing a first rate of change of the anode potential with a second rate of change of the cathode potential. The anode and the cathode are balanced if the first rate of change is comparable to the second rate of change at the end of discharging of the battery cell. On the other hand, the anode and the cathode are imbalanced if the first rate of change is significantly different from the second rate of change at the end of the discharging of the battery cell.

In some embodiments, the system also uses the assessed state-of-health to further modify the charging technique for the battery.

BRIEF DESCRIPTION OF THE FIGURES

The patent or application file contains at least one drawing executed in color. Copies of this patent or patent application publication with color drawing(s) will be provided by the Office upon request and payment of the necessary fee.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Embodiments provide a method and system for monitoring a battery in a portable electronic device. The battery may include one or more cells in a parallel and/or series configuration and supply power to a mobile phone, laptop computer, portable media player, tablet computer, and/or other battery-powered electronic device. For example, the battery may correspond to a lithium-polymer battery that includes one or more cells, each of which includes a jelly roll of layers wound together (e.g., a cathode with an active coating, a separator, and an anode with an active coating), and a flexible pouch enclosing the jelly roll. In addition, the battery may be reused up to a number of charge cycles before losing enough capacity to reach an end-of-life. The battery may also swell as capacity diminishes over time.

More specifically, embodiments provide a method and system for using a reference electrode in the battery to manage the design and use of the battery. The reference electrode may include a nickel tab and a lithium strip disposed around the nickel tab, and may be placed at the center of the layers of the jelly roll or at the periphery of the layers. The reference electrode may additionally allow the cathode potential of the cathode and/or the anode potential of the anode to be monitored.

First, the reference electrode may be used to assess the electrode balance of the battery and update the design of the battery based on the assessed electrode balance. To assess the electrode balance, the reference electrode may be used to monitor the battery's anode potential and cathode potential during discharging of the battery, and a first rate of change of the anode potential may be compared with a second rate of change of the cathode potential. The anode and cathode may be assessed as balanced if the first rate of change is comparable to the second rate of change at the end of the discharging of the battery cell. Conversely, an electrode imbalance may be found if the first rate of change is significantly higher than the second rate of change at the end of the discharging. The electrode imbalance may then be corrected by increasing the amount of anode active material in the design of the battery, for example.

Second, the reference electrode may be used to manage use of the battery with the portable electronic device. During charging of the battery in the portable electronic device, the anode potential of the anode may be obtained using the reference electrode. If the anode potential falls below an anode potential threshold, the charging technique for the battery may be modified to extend the battery's cycle life. For example, the charge current of the battery may be periodically reduced to keep the anode potential above an anode potential threshold of 0.0V.

Similarly, the reference electrode may be used to monitor the anode and cathode potentials during use of the battery with the portable electronic device. The anode and cathode potentials may then be used to assess the battery's state-of-health. For example, the anode and cathode potentials may be monitored to analyze a fault in the battery, assess an electrode balance of the anode and the cathode, and/or detect degradation in the battery. Finally, the assessed state-of-health may be used to further modify the charging technique for the battery.

Figure 1:
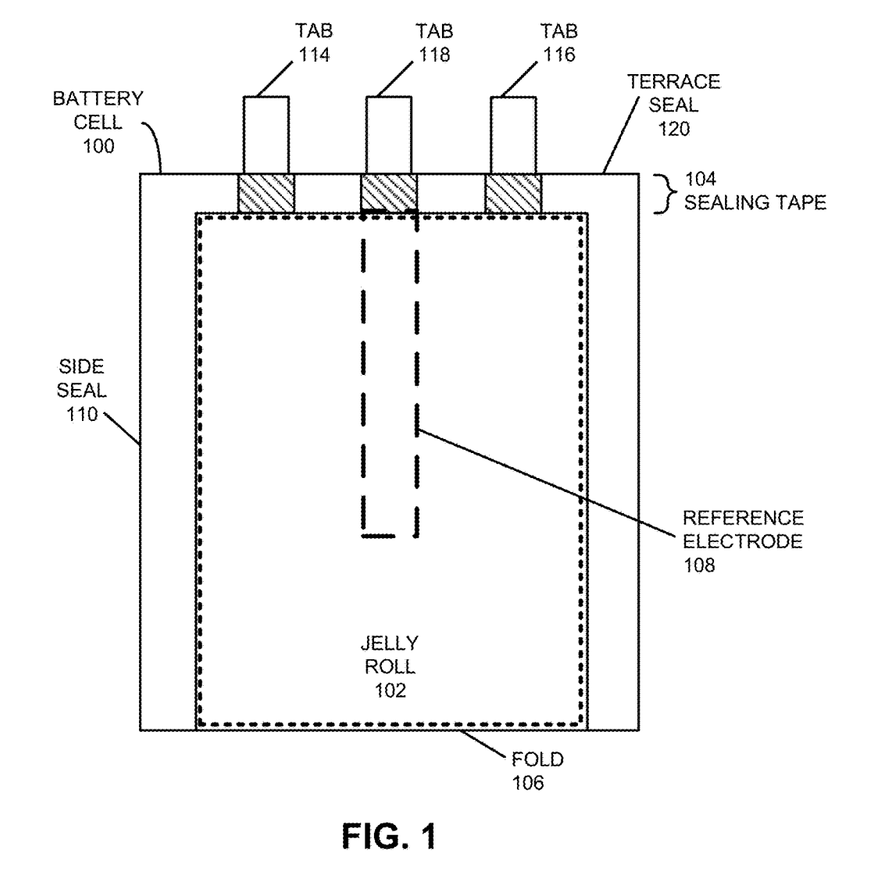
FIG. 1 shows a battery cell in accordance with an embodiment.

FIG. 1 shows a battery cell 100 in accordance with an embodiment. Battery cell 100 may correspond to a lithium-polymer cell that is used to power a portable electronic device. Battery cell 100 includes a jelly roll 102 containing a number of layers which are wound together, including a cathode with an active coating, a separator, and an anode with an active coating. More specifically, jelly roll 102 may include one strip of cathode material (e.g., aluminum foil coated with a lithium compound) and one strip of anode material (e.g., copper foil coated with carbon) separated by one strip of separator material (e.g., conducting polymer electrolyte). The cathode, anode, and separator layers may then be wound on a mandrel to form a spirally wound structure. Jelly rolls are well known in the art and will not be described further.

During assembly of battery cell 100, jelly roll 102 is enclosed in a flexible pouch, which is formed by folding a flexible sheet along a fold line 106. For example, the flexible sheet can include aluminum with a polymer film, such as polypropylene. After the flexible sheet is folded, the flexible sheet can be sealed, for example by applying heat along side seal 110 and along a terrace seal 120.

Battery cell 100 also includes a set of conductive tabs 114-116 coupled to the cathode and the anode. Conductive tabs 114-116 may extend through seals in the pouch (for example, formed using sealing tape 104) to provide terminals for battery cell 100. Conductive tabs 114-116 may then be used to electrically couple battery cell 100 with one or more other battery cells to form a battery pack.

In one or more embodiments, battery cell 100 also includes a reference electrode 108. As with the cathode and the anode, reference electrode 108 may be coupled to a conductive tab 118 that extends through seals in the pouch to provide a terminal. More specifically, reference electrode 108 may include a nickel tab (e.g., conductive tab 118) and a lithium strip disposed around the nickel tab.

Reference electrode 108 may then be used to facilitate the design and/or use of battery cell 100 with the portable electronic device. As discussed in further detail below, reference electrode 108 may be used to monitor the cathode potential of the cathode and/or the anode potential of the anode during charging, discharging, and/or use of battery cell 100 with the portable electronic device. The monitored cathode and/or anode potentials may then be used to update the design of battery cell 100, modify a charging technique for battery cell 100, and/or assess the state-of-health of battery cell 100.

Figure 2:
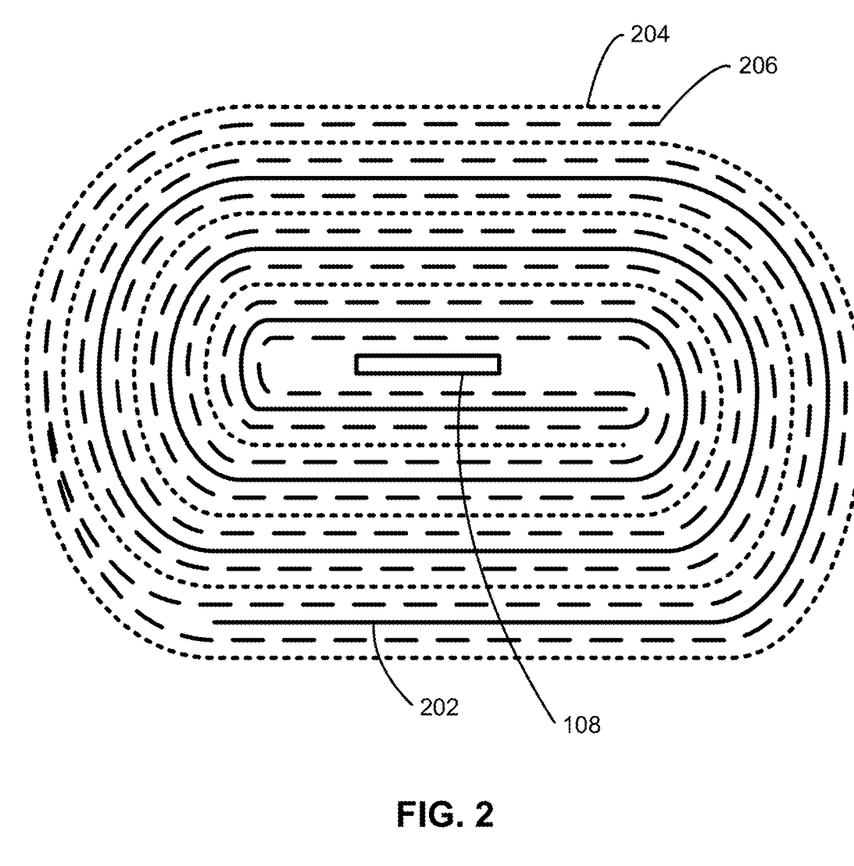
FIG. 2 shows a cross-sectional view of a battery cell in accordance with an embodiment.

FIG. 2 shows a cross-sectional view of a battery cell in accordance with an embodiment. More specifically, FIG. 2 shows the placement of reference electrode 108 within a jelly roll containing a layer of cathode 202, a layer of anode 204, and a layer of separator 206. As shown in FIG. 2, reference electrode 108 is placed at the center of the layers of the jelly roll. Furthermore, reference electrode 108 is surrounded by separator 206 to prevent electrical contact between reference electrode 108 and cathode 202 and/or anode 204.

Figure 3:
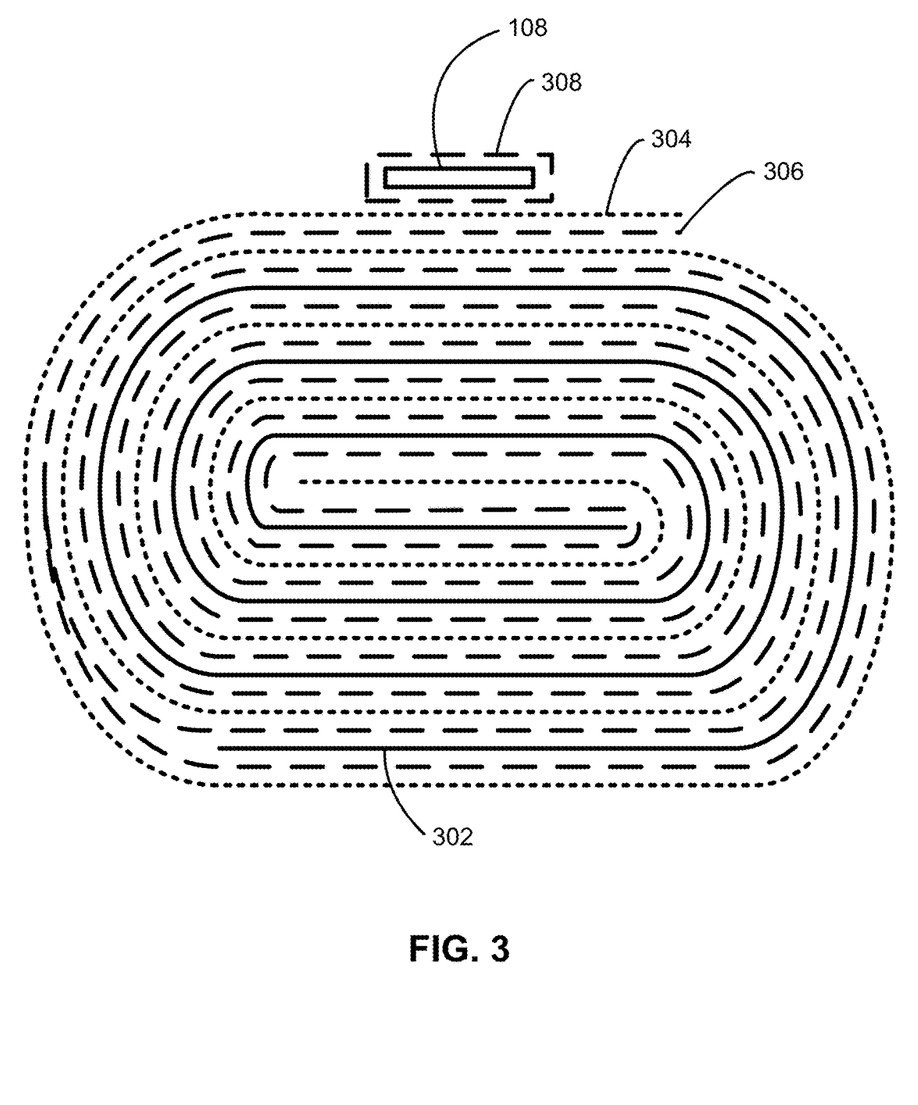
FIG. 3 shows a cross-sectional view of a battery cell in accordance with an embodiment.

FIG. 3 shows a cross-sectional view of a battery cell in accordance with an embodiment. As with FIG. 2, FIG. 3 shows the placement of reference electrode 108 within a jelly roll containing layers of cathode 302, anode 304, and separator 306. However, unlike FIG. 2, reference electrode 108 is positioned at the periphery of the layers instead of the center of the layers. In addition, reference electrode 108 is surrounded by a second layer of separator 308 to electrically isolate reference electrode 108 from anode 304 and/or cathode 302. The placement of reference electrode 108 at the periphery of the jelly roll's layers may allow a conductive nickel tab (e.g., tab 118 of FIG. 1) for reference electrode 108 to extend from an arbitrary seal in the battery cell. For example, the conductive tab may be placed at the periphery of the layers and extend from a side seal of the battery cell and/or orthogonally from the conductive tabs for cathode 302 and anode 304 if the battery cell is narrow and/or space between the tabs for cathode 302 and anode 304 is limited.

Figure 4:
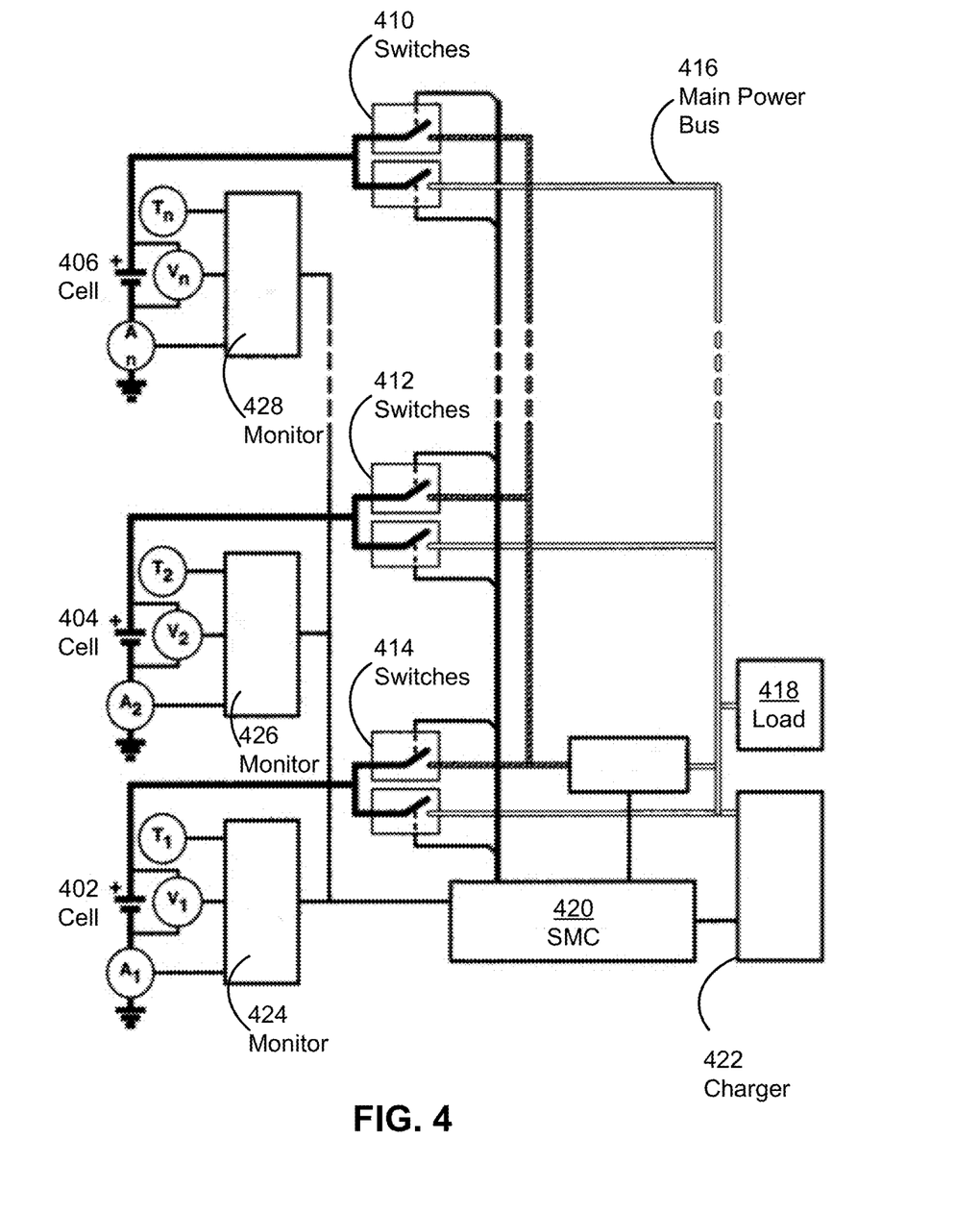
FIG. 4 shows a schematic of a system in accordance with an embodiment.

FIG. 4 shows a schematic of a system in accordance with an embodiment. The system may provide a power source to a portable electronic device, such as a mobile phone, personal digital assistant (PDA), laptop computer, tablet computer, portable media player, and/or peripheral device. In other words, the system may correspond to a battery that supplies power to a load 418 from one or more components (e.g., processors, peripheral devices, backlights, etc.) within the portable electronic device. For example, the battery may correspond to a lithium-polymer battery that includes one or more cells 402-406, each of which includes a jelly roll of layers wound together (e.g., a cathode with an active coating, a separator, and an anode with an active coating), and a flexible pouch enclosing the jelly roll. Each cell 402-406 may also include a reference electrode, such as reference electrode 108 of FIG. 1. As shown in FIG. 4, the system also includes a set of switches 410-414, a main power bus 416, a system microcontroller (SMC) 420, a charger 422, and a set of monitors 424-428.

In one or more embodiments, cells 402-406 are connected in a series and/or parallel configuration with one another using main power bus 416. Each cell 402-406 may include a sense resistor (not shown) that measures the cell's current. Furthermore, the voltage and temperature of each cell 402-406 may be measured with a thermistor (not shown), which may further allow a battery "gas gauge" mechanism to determine the cell's state-of-charge, impedance, capacity, charging voltage, and/or remaining charge. Measurements of voltage, current, temperature, and/or other parameters associated with each cell 402-406 may be collected by a corresponding monitor 424-428. Alternatively, one monitoring apparatus may be used to collect sensor data from multiple cells 402-406 in the battery.

Data collected by monitors 424-428 may then be used by SMC 420 to assess the state-of-charge, capacity, and/or health of cells 402-406. Monitors 424-428 and SMC 420 may be implemented by one or more components (e.g., processors, circuits, etc.) of the portable electronic device.

In particular, SMC 420 may use the data to manage use of the battery in the portable electronic device. For example, SMC 420 may correspond to a management apparatus that uses the state-of-charge of each cell 402-406 to adjust the charging and/or discharging of the cell by connecting or disconnecting the cell to main power bus 416 and charger 422 using a set of switches 410-414. Fully discharged cells may be disconnected from main power bus 416 during discharging of the battery to enable cells with additional charge to continue to supply power to load 418. Along the same lines, fully charged cells may be disconnected from main power bus 416 during charging of the battery to allow other cells to continue charging.

Those skilled in the art will appreciate that faults, degradation, and/or failures in the battery may be caused by factors such as age, use, defects, and/or inefficient charging. First, electrode imbalances in cells 402-406 may be caused by variability in manufacturing processes associated with cells 402-406, resulting in reduced capacities in cells 402-406. For example, a cell (e.g., cells 402-406) may be manufactured with less anode active material than is needed to fully discharge the electrical energy in the cathode of the cell, thus limiting the capacity and/or runtime of the cell.

In addition, charging of a cell may produce a reaction of electrolyte with cathode and anode material and/or lithium plating on the anode surface. As the cell ages, the capacity of the cell may decrease, and the cell may swell from enlargement of the electrode and/or gas buildup within the cell. Charging techniques that utilize singular constant-current rates may exceed the diffusion rate capability of the anode and accelerate lithium plating, swelling, and/or capacity reductions in the cell. Such charging techniques may eventually lead to an electrode imbalance, shortened cycle life, excessive swelling, and/or electrical short that causes damage to the cell and/or portable electronic device.

In one or more embodiments, the system of FIG. 4 includes functionality to mitigate electrode imbalances, lithium plating, loss of capacity, and/or swelling in the battery. As mentioned above, the reference electrode in each cell 402-406 may be used to monitor the cathode and/or anode potentials of the cell. For example, the electrode potential of the reference electrode may be set to 0 by convention, and the cathode and anode potentials of the cell may be measured with respect to the reference electrode. Consequently, monitors 424-428 may include functionality to obtain the voltages of the corresponding cells 402-406, as well as the individual contributions of the cathode and anode potentials to the cell voltages.

The monitored cathode and/or anode potentials may then be used by SMC 420 and/or another component of the system to manage the design and/or use of the battery with the portable electronic device. Initially, the cathode and anode potentials of each cell in the battery may be used to facilitate the design of the cell and/or battery. In particular, the cathode and anode potentials of the cell may be monitored as the cell discharges from a fully charged state, and the electrode balance of the cell may be assessed by comparing a first rate of change of the anode potential with a second rate of change of the cathode potential. The cell may be assessed as balanced if the first rate of change is comparable to the second rate of change at the end of the discharging of the battery cell. On the other hand, the cell may be imbalanced if the first rate of change is significantly higher than the second rate of change at the end of the discharging of the battery cell.

The assessed electrode balance may then be used to update the design of the cell. For example, the electrode balance of the cell may be assessed after manufacturing of the cell but prior to the deployment of the cell (e.g., in the portable electronic device). If an electrode imbalance is found in the cell, the amount of anode active material may be increased in the design of the cell so that subsequent versions of the cell have a more balanced ratio of anode active material to cathode active material.

The cathode and/or anode potentials of the cell may additionally be monitored after the cell is deployed in the portable electronic device (e.g., in situ) to facilitate use of the battery with the portable electronic device. First, the anode potential of the cell may be monitored during charging of the cell in the portable electronic device. If the anode potential falls below an anode potential threshold, SMC 420 may modify the charging technique for the cell and/or battery to extend the cycle life of the battery. For example, the anode potential threshold may be set to 0.0V to prevent a negative anode potential in the cell from causing lithium plating on the anode surface and/or swelling in the cell. To maintain an anode potential of above 0.0V, SMC 420 may begin charging the cell at a predefined constant charge current and switch between constant-current and constant-voltage charging of the cell as the anode potential drops below the anode potential threshold and/or the charge current of the cell drops to a pre-specified value. Modification of charge techniques for battery cells based on anode potentials is discussed in further detail below with respect to FIG. 5.

Second, the cell's cathode and anode potentials may be monitored during use of the battery with the portable electronic device and used to assess the cell's state-of-health. In other words, the monitored cathode and anode potentials may facilitate the detection and/or analysis of changes in the cell's electrode balance, degradation in the cell, and/or faults in the cell. For example, degradation in the cell may be detected if the cathode and anode become imbalanced over time. Similarly, monitoring of the cathode and anode potentials may facilitate the identification and/or diagnosis of faults and/or failures in the cell. Use of cathode and anode potentials to assess battery states-of-health is discussed in further detail below with respect to FIGS. 6-7.

Consequently, the use of reference electrodes to monitor cathode and anode potentials in the battery's cells may improve both the design of the battery and use of the battery with the portable electronic device. The cathode and anode potentials may first be monitored prior to deployment of the battery to ensure that sufficient anode active material is present in each cell to utilize the full capacity of the cell. After the battery is deployed, the cathode and anode potentials may continue to be monitored to facilitate efficient charging of the cells and/or assessment of the battery's state-of-health, which may extend the battery's cycle life and mitigate swelling, lithium plating, and/or reductions in the battery's capacity as the battery ages.

Figure 5:
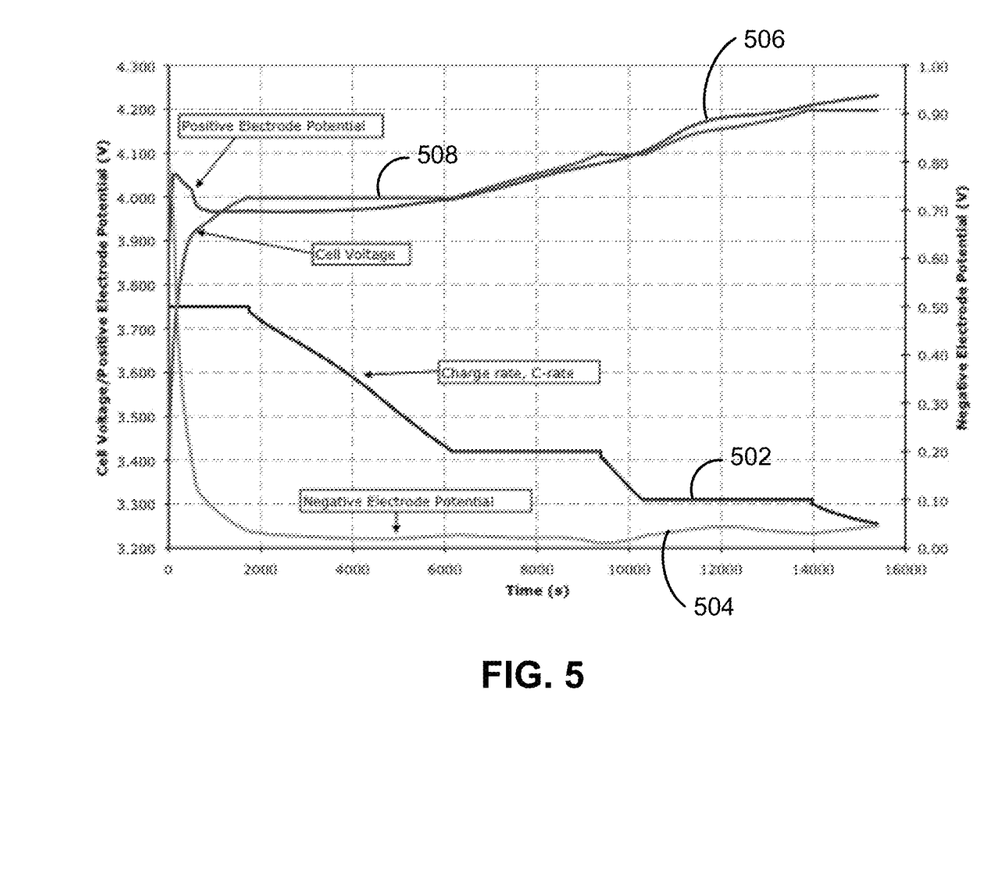
FIG. 5 shows an exemplary plot in accordance with an embodiment.

FIG. 5 shows an exemplary plot in accordance with an embodiment. More specifically, FIG. 5 shows a plot of a charging profile for a battery, with a charge rate 502 (e.g., charge current), anode potential 504, cathode potential 506, and cell voltage 508 for the battery plotted over time. As described above, a reference electrode in the battery (e.g., reference electrode 108 of FIG. 1) may be used to monitor anode potential 504 and/or cathode potential 506 during charging of the battery in a portable electronic device. Over the course of the charging, anode potential 504 may drop, while cathode potential 506 and cell voltage 508 may increase.

To extend the cycle life of the battery, anode potential 504 may be used to modify the charging technique for the battery. As shown in FIG. 5, the charging technique may alternate between constant-current charging, in which charge rate 502 is constant, and constant-voltage charging, in which charge rate 502 falls while the charge voltage of the battery is held constant.

In particular, the charging technique may be modified whenever anode potential 504 falls below an anode potential threshold. For example, charging of the battery may begin with charge rate 502 at a pre-specified constant charge current (e.g., 0.7 C) that charges the battery quickly, causing a steep drop in anode potential 504 and a rapid rise in both cathode potential 506 and cell voltage 508. If anode potential 504 falls below the anode potential threshold (e.g., 0.0V), the charging technique may be modified to use a constant charge voltage, which causes charge rate 502 to fall and allows anode potential 504 to recover. Once charge rate 502 reaches another pre-specified value (e.g., 0.5 C), constant-current charging of the battery may resume until anode potential 504 falls below the anode potential threshold for a second time. Constant-voltage charging may then be used to decrease the charge current until charge rate 502 reaches a third pre-specified value (e.g., 0.3 C), at which point constant-current charging is resumed. Finally, a third dip of anode potential 504 below the anode potential threshold may cause the battery to be charged at a constant charge voltage and decreasing charge rate 502 until the battery is fully charged.

The battery's cycle life may further be improved by modifying the charging technique in response to changes in the battery's state-of-health. Continuing with the above example, the pre-specified constant-current values used to charge the battery may be lowered from 0.7 C, 0.5 C, and 0.3 C to 0.7 C, 0.3 C, and 0.1 C after the battery experiences a certain amount of degradation (e.g., loss of capacity, electrode imbalance), as determined by monitoring anode potential 504 and cathode potential 506 during use of the battery with the portable electronic device.

By adapting charge rate 502 in response to changes in anode potential 504, the charging technique may charge the battery efficiently while mitigating lithium plating, swelling, loss of capacity, and/or other degradation in the battery. The use of multiple sets of constant-current values to charge the battery may additionally allow the charging technique to be optimized for the battery's current state-of-health, thus further extending the battery's cycle life.

Figure 6:
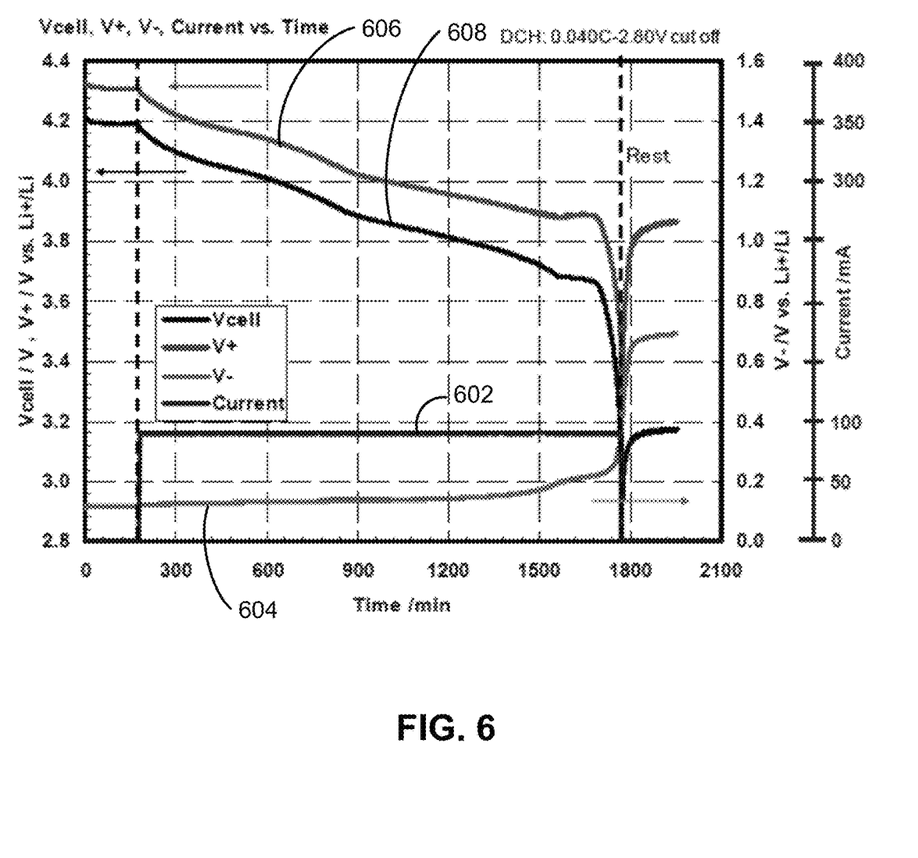
FIG. 6 shows an exemplary plot in accordance with an embodiment.

FIG. 6 shows an exemplary plot in accordance with an embodiment. More specifically, the plot of FIG. 6 shows a current 602, anode potential 604, cathode potential 606, and cell voltage 608 of the battery as the battery discharges from a fully charged state to a fully discharged state. Anode potential 604 and cathode potential 606 may be measured using a reference electrode for the battery, such as reference electrode 108 of FIG. 1.

Within the plot, cathode potential 606 and cell voltage 608 may steadily decrease once current 602 is supplied from the battery, while anode potential 604 may steadily increase. As the battery approaches a fully discharged state (e.g., at around 1800 minutes), cathode potential 606 and cell voltage 608 may drop steeply, and anode potential 604 may rise steeply. Furthermore, the sharpest drop in cathode potential 606 may coincide with the sharpest increase in anode potential 604, indicating that the cathode's capacity is depleted at the same time as the anode's capacity is replenished. In other words, anode potential 604 and cathode potential 604 may be representative of a battery that is balanced, fresh, and/or otherwise in a good state-of-health.

Figure 7:
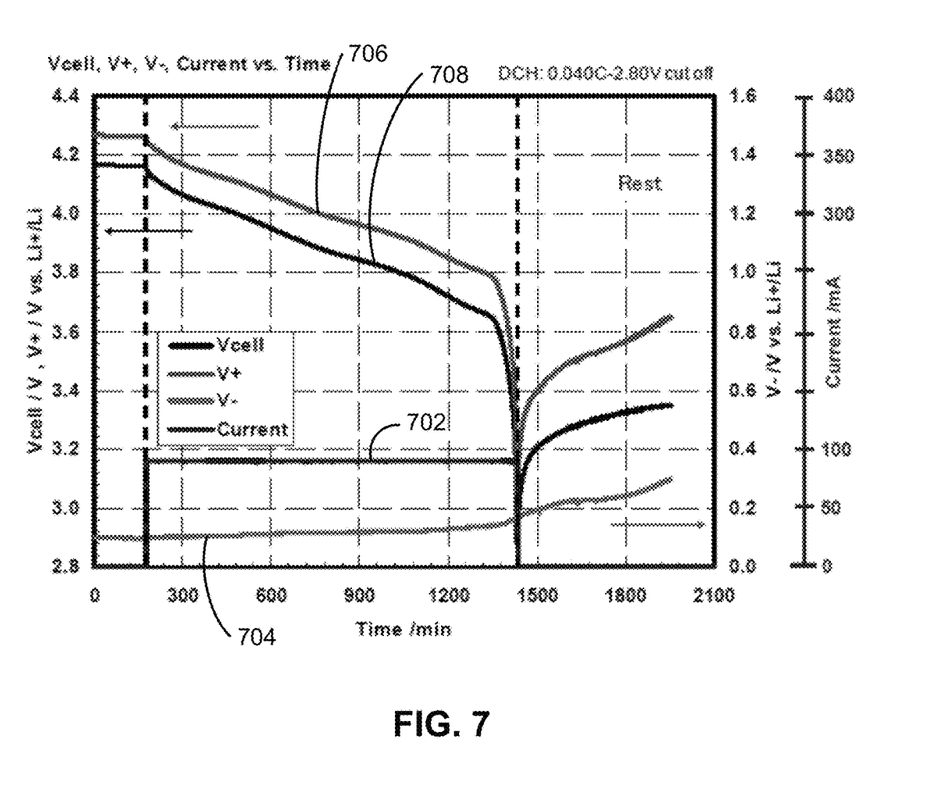
FIG. 7 shows an exemplary plot in accordance with an embodiment.

On the contrary, the plot of FIG. 7 shows a current 702, anode potential 704, cathode potential 706, and cell voltage 708 of a degraded battery as the battery discharges from a fully charged state to a fully discharged state. As with the battery of FIG. 6, anode potential 704 and cathode potential 706 may be monitored using a reference electrode in the battery.

As shown in FIG. 7, anode potential 704, cathode potential 706, and cell voltage 708 may start at levels that are comparable to anode potential 604, cathode potential 606, and cell voltage 608 of FIG. 6. However, cathode potential 706 and cell voltage 708 may decrease at a faster rate and drop sharply at an earlier time (e.g., around 1400 minutes). Moreover, anode potential 704 may remain relatively unchanged as cathode potential 706 and cell voltage 708 drop steeply, indicating that the anode's capacity is not replenished by the full depletion of the cathode's capacity. Anode potential 704 and cathode potential 706 may thus reveal degradation in the cathode that causes loss of capacity in the battery.

Figure 8:
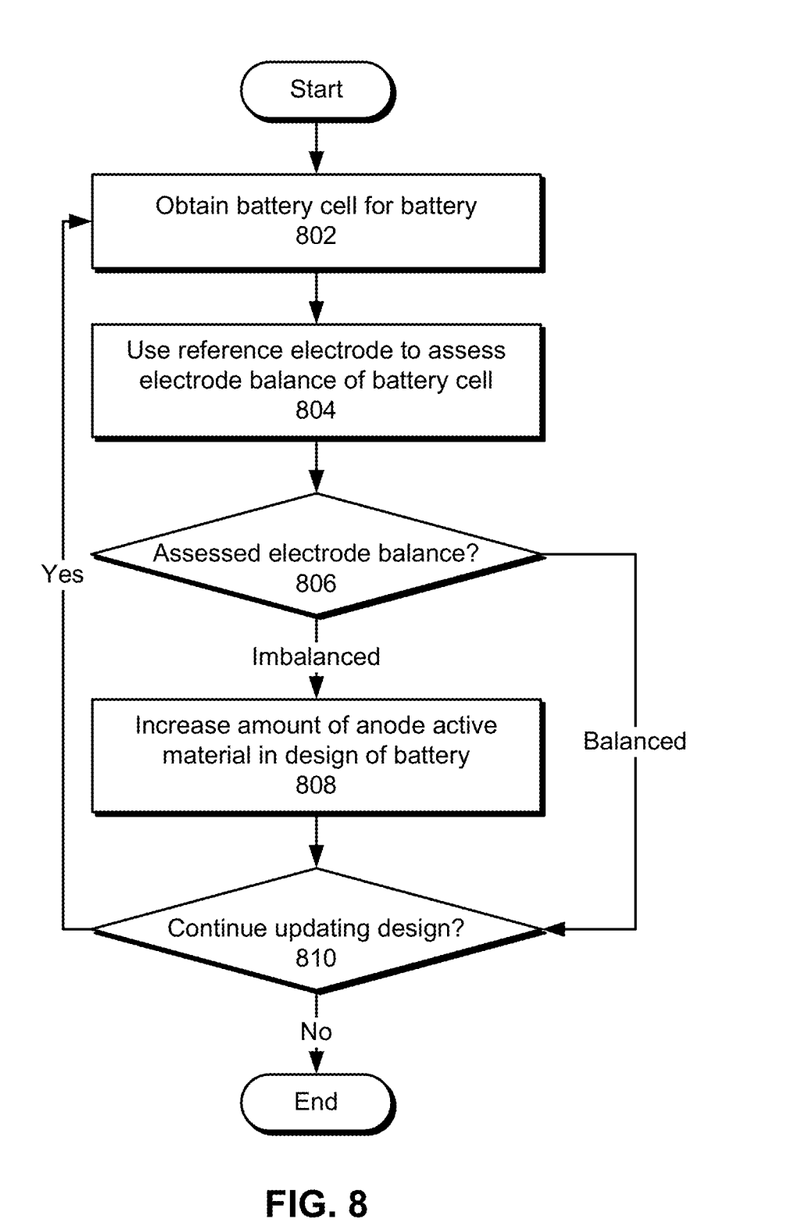
FIG. 8 shows a flowchart illustrating the process of facilitating the use of a battery with a portable electronic device in accordance with an embodiment.

FIG. 8 shows a flowchart illustrating the process of facilitating the use of a battery with a portable electronic device in accordance with an embodiment. In one or more embodiments, one or more of the steps may be omitted, repeated, and/or performed in a different order. Accordingly, the specific arrangement of steps shown in FIG. 8 should not be construed as limiting the scope of the embodiments.

Initially, a battery cell for a battery is obtained (operation 802). The battery cell may include a cathode with an active coating, a separator, an anode with an active coating, and a reference electrode. The reference electrode may be composed of a nickel tab and a lithium strip disposed around the nickel tab. The cathode, separator, and anode may be formed into layers that are wound together into a jelly roll, and the reference electrode may be placed at the center of the layers and/or at the periphery of the layers.

Next, the reference electrode is used to assess the electrode balance of the battery cell (operation 804). To assess the battery cell's electrode balance, the reference electrode may be used to monitor an anode potential of the anode and a cathode potential of the cathode during discharging of the battery cell. A first rate of change of the anode potential may then be compared with a second rate of change of the cathode potential. The anode and cathode may be assessed as balanced if the first rate of change is comparable to the second rate of change at the end of the discharging of the battery cell. Conversely, an electrode imbalance may be found if the first rate of change is significantly higher than the second rate of change at the end of the discharging.

The assessed electrode balance (operation 806) may then be used to update the design of the battery. If the anode and cathode are balanced, the design of the battery may not be updated. However, if the anode and cathode are imbalanced, the amount of anode active material may be increased in the design of the battery (operation 808). For example, the amount of anode active material may be increased to facilitate full use of the energy stored in the cathode during discharge of the battery.

The design may continue to be updated (operation 810). For example, the design may be updated until the design produces a battery with a desired balance between the anode and cathode. If the design is to be updated, a new battery cell (e.g., based on a new design) for the battery is obtained (operation 802), and a reference electrode in the battery cell is used to assess the electrode balance of the battery cell (operation 804). The battery's design may then be updated based on the assessed electrode balance (operations 806-808). Battery cells for the battery may thus continue to be obtained, monitored, and updated until the battery's design produces a balanced battery cell.

Figure 9:
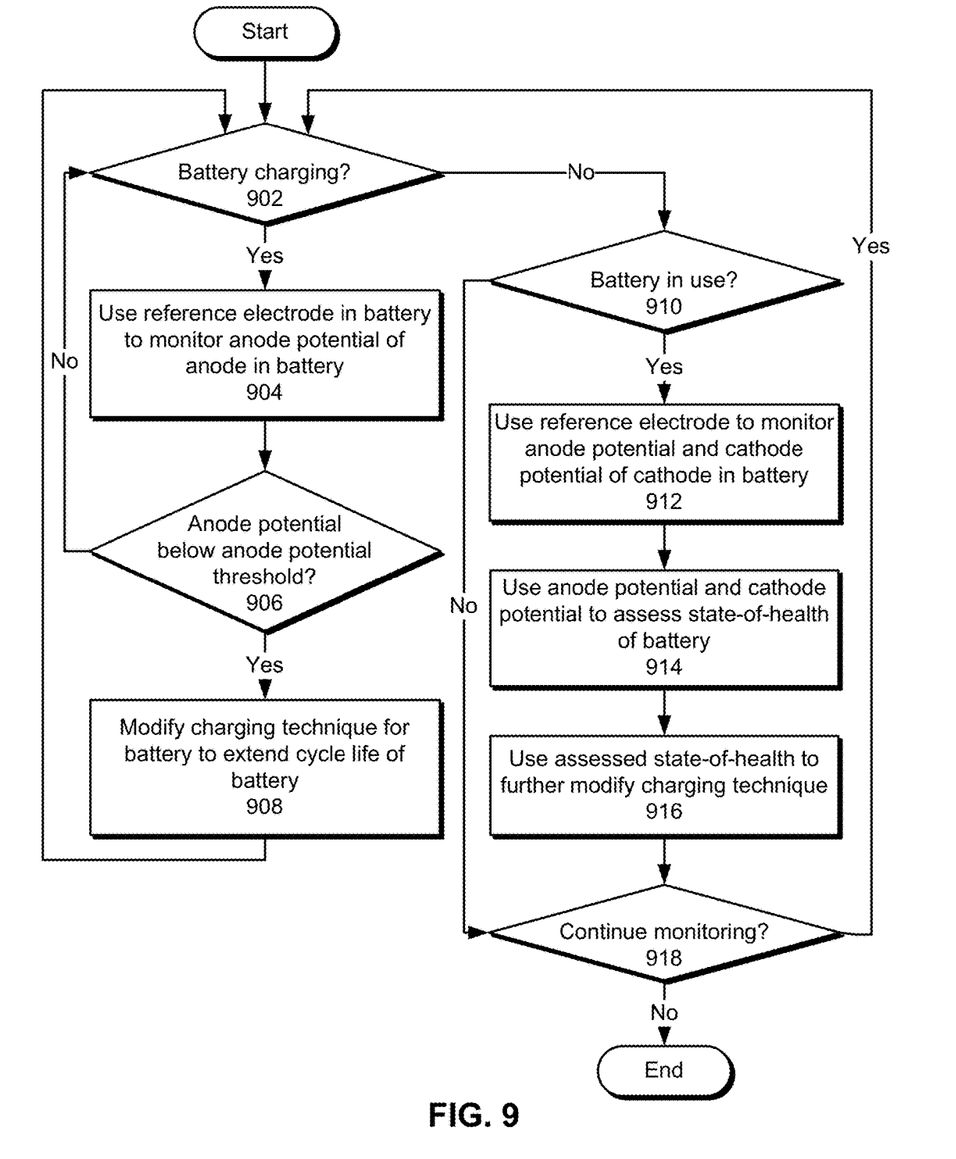
FIG. 9 shows a flowchart illustrating the process of managing use of a battery in a portable electronic device in accordance with an embodiment.

FIG. 9 shows a flowchart illustrating the process of managing use of a battery in a portable electronic device in accordance with an embodiment. In one or more embodiments, one or more of the steps may be omitted, repeated, and/or performed in a different order. Accordingly, the specific arrangement of steps shown in FIG. 9 should not be construed as limiting the scope of the embodiments.

First, charging of the battery (operation 902) in the portable electronic device may be managed. If the battery is charging, a reference electrode in the battery is used to monitor the anode potential of an anode in the battery (operation 904). The anode potential may also be compared with an anode potential threshold (operation 906). If the anode potential does not fall below the anode potential threshold, charging of the battery (operation 902) and monitoring of the anode potential (operation 904) may continue until the battery is no longer being charged.

If the anode potential falls below the anode potential threshold, the charging technique for the battery is modified to extend the cycle life of the battery (operation 908). For example, the charge current of the battery may be reduced once the anode potential falls below an anode potential threshold of 0.0V to prevent lithium plating, swelling, and/or other degradation caused by a negative anode potential during charging of the battery. Charging of the battery, monitoring of the anode potential, and/or modification of the charging technique (operations 902-908) may continue until the battery is fully charged and/or disconnected from a charger.

If the battery is not charging, the battery may be in use (operation 910). If the battery is not in use, the battery may continue to be monitored (operation 918) during use of the battery with the portable electronic device. If the battery is in use, the reference electrode is used to monitor both the anode potential and the cathode potential of a cathode in the battery (operation 912). The anode and cathode potentials may then be used to assess the state-of-health of the battery (operation 914). For example, the anode and cathode potentials may be used to analyze a fault in the battery, assess the electrode balance of the anode and cathode, and/or detect degradation in the battery. Finally, the assessed state-of-health may be used to further modify the charging technique (operation 916) for the battery. For example, degradation and/or aging in the battery may trigger a reduction in one or more constant charge currents used to charge the battery, while degradation beyond a certain point may cause use of the battery to be disabled to prevent damage to the portable electronic device.

The battery may continue to be monitored (operation 918) during charging of the battery and/or use of the battery with the portable electronic device. If the battery is to be monitored, charging of the battery (operation 902) is managed by monitoring the battery's anode potential (operation 904) and modifying the charging technique based on the anode potential threshold associated with the anode potential (operations 906-908). Moreover, use of the battery (operation 910) is managed by monitoring both the cathode and anode potentials (operation 912), using the monitored potentials to assess the battery's state-of-health (operation 914), and using the assessed state-of-health to further modify the charging technique (operation 916). The battery may thus continue to be used and monitored until the battery is replaced and/or use of the battery is disabled.

Figure 10:
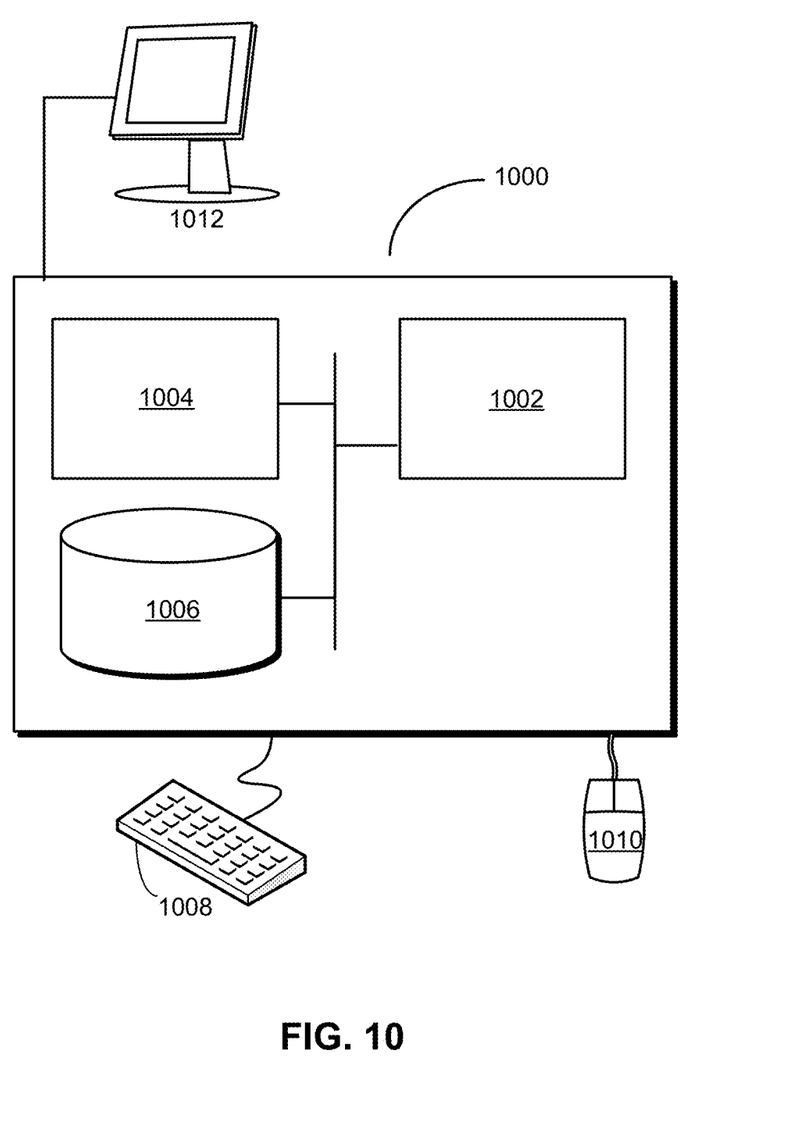
FIG. 10 shows a computer system in accordance with an embodiment.

FIG. 10 shows a computer system 1000 in accordance with an embodiment. Computer system 1000 includes a processor 1002, memory 1004, storage 1006, and/or other components found in electronic computing devices. Processor 1002 may support parallel processing and/or multi-threaded operation with other processors in computer system 1000. Computer system 1000 may also include input/output (I/O) devices such as a keyboard 1008, a mouse 1010, and a display 1012.

Computer system 1000 may include functionality to execute various components of the present embodiments. In particular, computer system 1000 may include an operating system (not shown) that coordinates the use of hardware and software resources on computer system 1000, as well as one or more applications that perform specialized tasks for the user. To perform tasks for the user, applications may obtain the use of hardware resources on computer system 1000 from the operating system, as well as interact with the user through a hardware and/or software framework provided by the operating system.

In one or more embodiments, computer system 1000 provides a system for managing use of a battery in a portable electronic device. The system may include a monitoring apparatus that uses a reference electrode in the battery to monitor an anode potential of an anode in the battery during charging of the battery in the portable electronic device. The system may also include a management apparatus that modifies a charging technique for the battery to extend a cycle life of the battery if the anode potential falls below an anode potential threshold. In addition, the monitoring apparatus may also use the reference electrode to monitor the anode potential and a cathode potential of a cathode in the battery during use of the battery with the portable electronic device, and the management apparatus may use the anode potential and the cathode potential to assess a state-of-health of the battery. Finally, the management apparatus may use the assessed state-of-health to modify the charging technique for the battery.

In addition, one or more components of computer system 1000 may be remotely located and connected to the other components over a network. Portions of the present embodiments (e.g., monitoring apparatus, management apparatus, etc.) may also be located on different nodes of a distributed system that implements the embodiments. For example, the present embodiments may be implemented using a cloud computing system that monitors and manages batteries in remote portable electronic devices.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A process for managing use of a battery in a portable electronic device, the process comprising:
using a reference electrode in the battery to monitor an anode potential between the reference electrode and an anode in the battery and a cathode potential between the reference electrode and a cathode of the battery, wherein the reference electrode is not in electrical contact with the anode or the cathode; and
analyzing the anode potential and the cathode potential using a computer to assess a state of health of the battery, wherein using the anode potential and the cathode potential to assess the state-of-health of the battery comprises assessing an electrode balance of the anode and the cathode.

2. The process of claim 1 further comprising:
when the anode potential falls below an anode potential threshold during charging of the battery, using the computer to execute instructions embodied on a non-transitory computer-readable storage medium to modify a charging technique for the battery.

3. The process of claim 2, wherein the anode potential threshold is 0.0V.

4. The process of claim 1, wherein assessing the electrode balance of the anode and the cathode comprises determining whether the anode and the cathode are balanced based on a comparison of a first rate of change of the anode potential and a second rate of change of the cathode potential.

5. The process of claim 1, further comprising:
using the assessed state-of-health to modify a charging technique for the battery.

6. A method for facilitating the use of a battery with a portable electronic device, comprising:
obtaining a battery cell for the battery, wherein the battery cell comprises layers which are wound together, including a cathode with an active coating, a separator, an anode with an active coating, and a reference electrode;
using the reference electrode to assess an anode potential of the anode and a cathode potential of the cathode during discharging of the battery cell; and
updating a design of the battery based on the assessed electrode balance.

7. The method of claim 6, wherein using the reference electrode to assess the anode potential and the cathode potential further comprises determining whether the anode and the cathode are balanced based on a comparison of a first rate of change of the anode potential during the discharge and a second rate of change of the cathode potential during the discharge.

8. The method of claim 7, wherein updating the design of the battery based on the assessed electrode balance comprises:
when the battery cell is imbalanced, increasing an amount of anode active material in the design of the battery.

9. The method of claim 6, wherein the reference electrode is placed at a center of the layers or at a periphery of the layers.

10. A system for managing use of a battery in a portable electronic device, comprising:
a monitoring apparatus configured to use a reference electrode in the battery to monitor an anode potential between the reference electrode and an anode in the battery and a cathode potential of a cathode of the battery, wherein the reference electrode is not in electrical contact with the anode or the cathode; and
a management apparatus configured to use the anode potential and the cathode potential to assess a state of health of the battery by assessing an electrode balance of the anode and the cathode.

11. The system of claim 10, wherein:
the management apparatus is further configured to modify a charging technique for the battery when the anode potential falls below an anode potential threshold.

12. The system of claim 10, wherein assessing the electrode balance of the anode and the cathode comprises determining whether the anode and the cathode are balanced based on a comparison of a first rate of change of the anode potential and a second rate of change of the anode potential.

13. The system of claim 10, wherein the management apparatus is further configured to use the assessed state-of-health to modify the charging technique for the battery.

14. A computer-readable storage medium storing instructions that when executed by a computer cause the computer to perform a method for managing use of a battery in a portable electronic device, the method comprising:

using a reference electrode in the battery to monitor an anode potential between the reference electrode and an anode in the battery and a cathode potential between the reference electrode and a cathode in the battery, wherein the reference electrode is not in electrical contact with the anode or the cathode;

using the anode potential and the cathode potential to assess a state of health of the battery, wherein using the anode potential and the cathode potential to assess the state-of-health of the battery comprises assessing an electrode balance of the anode and the cathode.

15. The computer-readable storage medium of claim 14 wherein the method further comprises:

when the anode potential falls below an anode potential threshold, modifying a charging technique for the battery.

16. The computer-readable storage medium of claim 14, wherein assessing the electrode balance of the anode and the cathode comprises determining whether the anode and the cathode are balanced based on a comparison of a first rate of change of the anode potential and a second rate of change of the cathode potential.

17. A portable electronic device, comprising:
a set of components powered by a battery;
a monitoring apparatus configured to:
use a reference electrode in the battery to monitor an anode potential between the reference electrode and an anode in the battery and a cathode potential between the reference electrode and a cathode in the battery, wherein the reference electrode is not in electrical contact with the anode or the cathode; and
use the anode potential and the cathode potential to assess a state of health of the battery, wherein using the anode potential and the cathode potential to assess the state-of-health of the battery comprises assessing an electrode balance of the anode and the cathode.

18. The portable electronic device of claim 17 further comprising:
a management apparatus configured to modify a charging technique for the battery when the anode potential falls below an anode potential threshold.

19. The portable electronic device of claim 18, wherein the management apparatus is further configured to use the assessed state-of-health to modify the charging technique for the battery.

20. The portable electronic device of claim 17, wherein assessing the electrode balance of the anode and the cathode comprises determining whether the anode and the cathode are balanced based on a comparison of a first rate of change of the anode potential and a second rate of change of the cathode potential.

* * * * *

UNITED STATES PATENT AND TRADEMARK OFFICE
CERTIFICATE OF CORRECTION

PATENT NO. : 9,698,451 B2
APPLICATION NO. : 13/177468
DATED : July 4, 2017
INVENTOR(S) : Ramesh C. Bhardwaj et al.

It is certified that error appears in the above-identified patent and that said Letters Patent is hereby corrected as shown below:

Column 12, Line 63: Replace the phrase "a second rate of change of the anode potential" with the phrase --a second rate of change of the cathode potential--.

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*